(12) United States Patent
Scipioni (10) Patent No.: US 7,160,475 B2
(45) Date of Patent: Jan. 9, 2007

(54) FABRICATION OF THREE DIMENSIONAL STRUCTURES

(75) Inventor: Lawrence Scipioni, Danvers, MA (US)

(73) Assignee: FEI Company, Hillsboro, OR (US)

(*) Notice: Subject to any disclaimer, the term of this patent is extended or adjusted under 35 U.S.C. 154(b) by 317 days.

(21) Appl. No.: 10/301,208

(22) Filed: Nov. 21, 2002

(65) Prior Publication Data

US 2004/0099636 A1 May 27, 2004

(51) Int. Cl.
*G21G 5/00* (2006.01)

(52) U.S. Cl. .............. 216/2; 216/59; 216/65; 216/66; 204/192.1; 204/192.11; 204/192.13; 204/192.33; 204/192.34; 219/121.6; 250/492.1; 250/492.3; 427/457

(58) Field of Classification Search ............... 216/66; 438/514; 427/523; 156/345.39; 118/723 FI, 118/723 CB See application file for complete search history.

(56) References Cited

U.S. PATENT DOCUMENTS

| | | | |
|---|---|---|---|
| 4,418,283 A * | 11/1983 | Trotel ................. | 250/492.2 |
| 4,876,112 A | 10/1989 | Kaito et al. ............ | 427/38 |
| 4,914,304 A * | 4/1990 | Koyama ............... | 250/492.2 |
| 5,051,556 A * | 9/1991 | Sakamoto et al. ...... | 219/121.25 |
| 5,099,133 A * | 3/1992 | Yamada ................ | 250/492.2 |
| 5,173,582 A * | 12/1992 | Sakamoto et al. ...... | 219/121.25 |
| 5,389,196 A | 2/1995 | Bloomstein et al. ..... | 156/643 |
| 5,435,850 A | 7/1995 | Rasmussen ............ | 118/726 |
| 5,589,042 A * | 12/1996 | Robinson et al. ....... | 204/192.34 |
| 5,759,423 A * | 6/1998 | Sohda et al. .......... | 216/45 |
| 5,827,786 A * | 10/1998 | Puretz ................. | 438/789 |
| 5,851,413 A | 12/1998 | Casella et al. ........ | 216/92 |
| 5,868,952 A * | 2/1999 | Hatakeyama et al. .... | 216/66 |
| 6,011,269 A * | 1/2000 | Veneklasen et al. .... | 250/492.23 |
| 6,437,347 B1 * | 8/2002 | Hartley et al. ........ | 250/491.1 |
| 6,455,863 B1 * | 9/2002 | Babin et al. .......... | 250/492.23 |
| 2001/0045525 A1 * | 11/2001 | Gerlach et al. ........ | 250/492.1 |
| 2002/0151140 A1 * | 10/2002 | Nakasugi .............. | 438/275 |
| 2003/0107008 A1 * | 6/2003 | Wakimoto ............. | 250/492.23 |
| 2004/0178366 A1 * | 9/2004 | Ando et al. ........... | 250/492.22 |

FOREIGN PATENT DOCUMENTS

| JP | 06264272 A | * | 9/1994 |
|---|---|---|---|
| JP | 09246142 A | * | 9/1997 |

* cited by examiner

*Primary Examiner*—Allan Olsen
(74) *Attorney, Agent, or Firm*—Michael O. Scheinberg; Hilgers, Bell & Richards LLP (57) ABSTRACT

The present disclosure relates to a method for generating a three-dimensional microstructure in an object. In one embodiment, a method for fabricating a microscopic three-dimensional structure is provided. A work piece is provided that includes a target area at which the three-dimensional structure is to be fabricated. The target area has a plurality of virtual dwell points. A shaped beam is provided to project onto the work piece. The intersection of the shaped beam with the work piece defines a beam incidence region that has a desired shape. The beam incidence region is sufficiently large to encompass multiple ones of the virtual dwell points. The shaped beam is moved across the work piece such that different ones of the virtual dwell points come into it and leave it as the beam moves across the work piece thereby providing different doses to different ones of the virtual dwell points as the different dwell points remain in the beam incidence region for different lengths of time during the beam scan. In this way, a desired dose array of beam particles is applied onto the target area to form the three dimensional microstructure.

7 Claims, 6 Drawing Sheets

FIG. 1

PRIOR ART

FABRICATION OF THREE DIMENSIONAL STRUCTURES

TECHNICAL FIELD OF THE INVENTION

The present disclosure relates generally to the creation of three-dimensional micro structures. In particular, the present invention relates to a scheme for generating such microstructures using a shaped beam such as a shaped charged particle or light beam.

BACKGROUND OF THE INVENTION

There exists a need to create three-dimensional microstructures in many applications including processing integrated circuits, trimming thin film heads for disk drives, processing Micro Electro Mechanical Systems (MEMS), and preparing work pieces for viewing in Transmission Electron Microscopes (TEMs). These applications and others continually demand increased speed and accuracy for creating ever smaller, more elaborate, microscopic features on solid surfaces. Focused ion beam ("FIB") technology, with its ability to both remove and deposit material on the sub-micron size scale, is often used to perform three dimensional device modifications. Typically, the FIB is used to either remove or deposit a thin layer of material. With many applications, many cubic microns of material must be removed or added in seconds or minutes.

The standard methods for creating microscopic features involve scanning a finely focused ion beam in a raster type pattern over the target surface to mill, etch, or deposit material. The target area is generally divided into a matrix of virtual dwell points (or pixels) arranged in a grid like pattern. The beam is scanned over each line of virtual dwell points, one line at a time. As it is scanned in this way, its intensity is modulated (e.g., turned on or off) as the beam passes over a pixel so that each pixel receives an appropriate "shot" from the beam. In this way, a desired two-dimensional pattern is achieved once all of the lines of pixels have been scanned.

By so directing beam particles onto a target, one can either mill or etch the object or deposit material onto it. Milling involves the direct removal of surface material by the impact of ions in a process called sputtering. Etching, assisted by the ion beam, can be done by introducing a reactive vapor that can volatize the target material and thereby increase the speed of this process. In FIB deposition, a gas, typically including organometallic compounds, is directed toward the impact point of the FIB on the target surface. The gas decomposes in the presence of the ion beam to add material to the target surface. Ion beam assisted deposition processes are described, for example, in U.S. Pat. No. 4,876,112 to Kaito et al. for "Process for Forming Metallic Patterned Film," and U.S. Pat. No. 5,827,786 to Puretz for "Charged Particle Deposition of Electrically Insulating Films."

Fully three dimensional structures are generally created by considering the shape of the desired structure in thin slices parallel to the surface. One either etches into the surface or deposits onto it, one slice at a time, by defining an appropriate raster-type scan operation for each slice. The process is continued until the entire structure is generated. Such a process is described, for example, in U.S. Pat. No. 5,389,196 for "Methods for Fabricating Three-Dimensional Microstructures."

Unfortunately, with this conventional approach, it is important that the beam be smaller (in cross section) than any of the facets of the structure to be created so that they are created with sufficient fidelity. In many applications, this may require beams that are only several nanometers in diameter. Such beams can be costly if not impossible to produce. In addition, only certain types of beam generation methods with certain types of beam sources (e.g., gallium ion source) may be available. This can be problematic when working with objects made of certain materials that may adversely react with such beam types.

Moreover, beams having very small cross-sections typically have fewer ions (reduced beam current), so processing time for smaller beams is longer. To make up for the smaller diameters, beam current densities for these sharper beams are typically increased in order to retain sufficiently high overall beam current for minimizing processing time. This, however, has its own associated problems. With higher beam current densities, as the ion beam dwells on each virtual dwell point in its scan pattern, adsorbed gas molecules are reacted and removed faster than they can be replenished by the gas jet. This phenomena is known as "overmilling" and applies to both FIB etching and depositing when the gas flux is insufficient to support the ion flux. This extensive gas removal makes the ion beam induced etch or deposition less efficient than if a higher density of adsorbed molecules were present on the surface. In deposition, the low density of the adsorbed gas not only reduces the deposition rate, but also some of the material already deposited may be etched away by the ion beam.

Accordingly, what is needed is an improved method and system for creating three-dimensional micro-structures.

SUMMARY OF THE INVENTION

The present disclosure relates to a method for generating a three-dimensional microstructure in an object. In one embodiment, a method for fabricating a microscopic three-dimensional structure is disclosed. A work piece is provided that includes a target area at which the three-dimensional structure is to be fabricated. The target area has a plurality of virtual dwell points. A shaped beam is provided to project onto the work piece. The intersection of the shaped beam with the work piece defines a beam incidence region that has a desired shape. The beam incidence region is sufficiently large to encompass multiple ones of the virtual dwell points. The shaped beam is moved across the work piece such that different ones of the virtual dwell points come into it and leave it as the beam moves across the work piece thereby providing different doses to different ones of the virtual dwell points as the different dwell points remain in the beam incidence region for different lengths of time during the beam scan. In this way, a desired dose array of beam particles is applied onto the target area to form the three dimensional microstructure.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DESCRIPTION OF ILLUSTRATIVE EMBODIMENTS

The present invention provides a way to create three-dimensional microstructures at object surfaces using shaped beams. The structures can be positive (grown on the surface), negative (milled or etched into the surface), or combinations of positive and negative. A shaped beam (e.g., ion, electron, photon) having a known shape and a current (or in the case of light, energy) distribution that is consistent over time is scanned over the surface of a specimen in a controlled fashion to deposit a desired dose array of beam particles over the target surface. In this context, the term "dose array" refers to the number of beam particles (e.g., ions, electrons, photons) impacting each virtual dwell point in an imaginary grid (or array) superimposed over the target scan area. While the term "array" generally refers to a rectangular arrangement of quantities in rows and columns, as in a matrix, as used herein, it is intended for "array" to be construed more broadly. It could be of any shape corresponding to that of a target scan area. If enough array cells are used and thus, the size of the cells are sufficiently small, they can reasonably model virtual dwell points in the scan area. The value of each cell in the dose array then becomes proportional to the amount of beam particles to be deposited on the virtual dwell point that corresponds to the cell. The dose array model serves as a way to think about the distribution of beam particles that are to be applied over the target scan area for generating the desired three dimensional micro-structure. The dose array model works regardless of whether the beam particles are applied discretely or continuously. When a shaped beam is scanned over a portion of a target scan area, the dose array for that portion becomes an image convolution of the beam (taking into account its shape and current or energy density) and the scan area portion as the beam passes over it.

System

Figure 1:
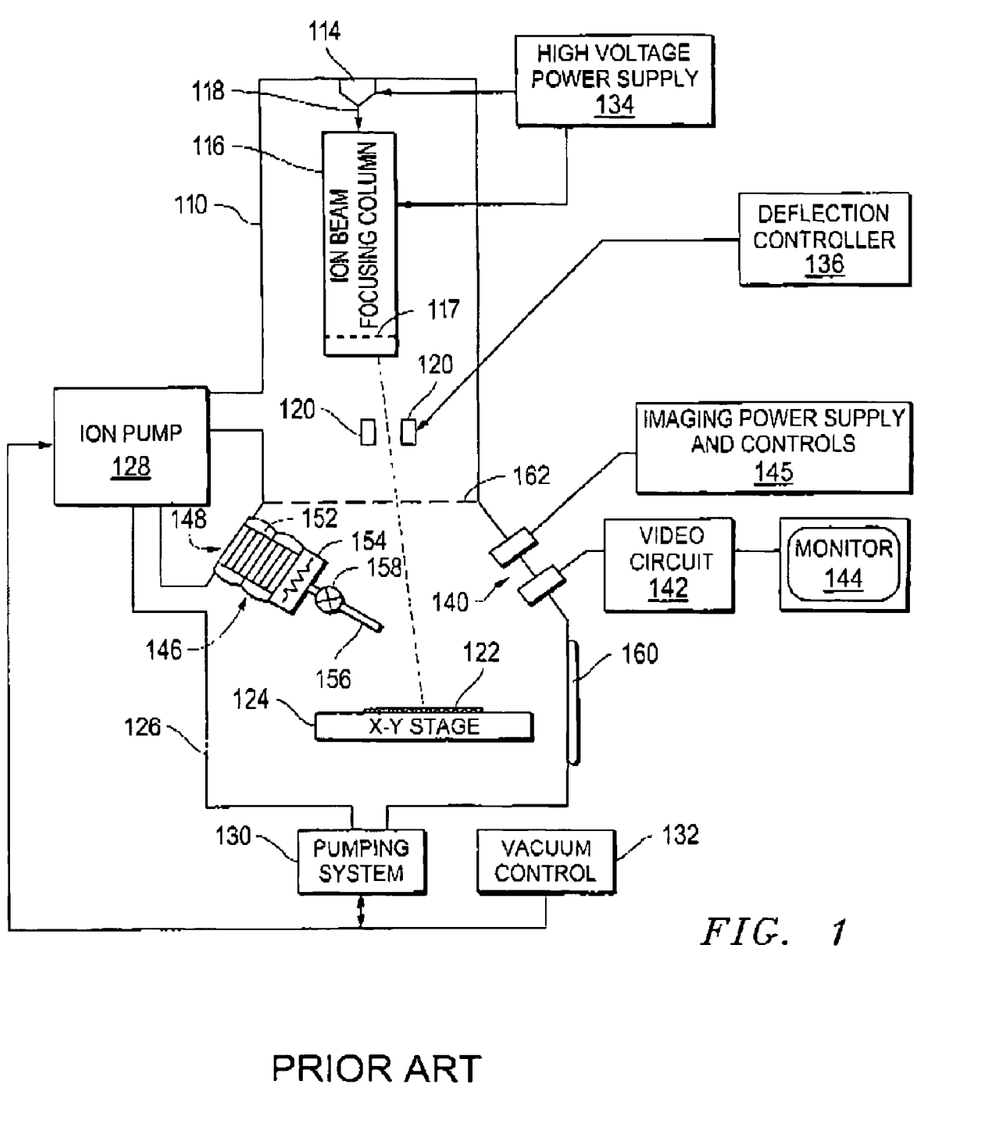
FIG. 1 shows a focused ion beam system in which a shaped ion beam can be produced and applied.

FIG. 1 shows one embodiment of a shaped focused ion beam ("FIB") system suitable for use with the present invention. The depicted shaped beam system includes an evacuated envelope 110 having a liquid metal ion source 114 and a focusing column 116, which includes an extractor electrode module and an electrostatic optical system (not shown) with an aperture member 117 for defining the cross-sectional shape of the ion beam 118. Focusing column 116 uses a two-lens ion focusing structure, the first lens forming an image of the ion source at or near the plane of the second lens and the second lens forming an image on the target plane of a shaping aperture placed between the first and second lenses. Skilled persons will understand that the lenses and other "optical" elements used with focused ion beams use electrostatic or magnetic fields to control ions in the beam, and that the optical elements are controlling a stream of ions. Also, the designs may include only one or up to several lenses.

Ion beam 118 passes from source 114 through column 116 and between electrostatic deflection modules schematically indicated at 120 toward work piece 122, which is removably mounted on movable X-Y stage 124 within the lower portion of chamber 126. The work piece 122 can be any material that may be worked upon by beam 118 to achieve a desired result. It could comprise, for example, a semiconductor device, photo-lithographic mask, magnetic storage head, and the like. The particular type of shaped beam that is used will depend on the object material, as well as on the result that is desired. An ion pump 128 is employed for evacuating neck portion 110. The chamber 126 is evacuated with turbomolecular and mechanical pumping system 130 under the control of vacuum controller 132.

High voltage power supply 134 is connected to liquid metal ion source 114, as well as to appropriate electrodes in focusing column 116 for forming an approximately 30 keV ion beam 118 and directing the same downwardly. Deflection controller 136, operated in accordance with a prescribed path such as a sweep across the target surface, is coupled to deflection plates 120 whereby beam 118 can be controlled to sweep a corresponding path on the target upper surface of work piece 122. In some systems, the deflection plates 120 are placed before the final lens, as is well known in the art. Through controller 136, a user can control beam 118 to be scanned in a desired manner through commands entered into a conventional user interface (not shown). Alternatively, controller 136 may access a memory storage device to upload instructions to cause the controller to control the system to scan a path, using a predefined beam shape, for generating a selected structure.

The source 114 typically provides a metal ion beam of gallium, although other ion sources, such as a multi-cusp or other plasma ion source, can be used. While this source is typically capable of being focused into a sub one-tenth micron wide beam at work piece 122, one advantage of the invention is that it doesn't require such acuity. In fact, it is capable of achieving equivalent (or even better) sharpness with the beam focused down to a lesser degree (e.g., focused to 5 microns). An electron multiplier 140 used for detecting secondary emission for imaging is connected to a power supply and controls 145 and to video circuit 142, which supplies drive for video monitor 144 for viewing work piece 122 as it is being worked upon.

A gas source 146 is located inwardly of the side of chamber 26 by translation device 148 adapted for positioning the source via support structure within bellows 152. U.S. Pat. No. 5,435,850 to Rasmussen for a "Gas injection System" and U.S. Pat. No. 5,851,413 to Casella, et al. for "Gas Delivery Systems for Particle Beam Processing," both assigned to the assignee of the present invention, disclose apparatuses for introducing and directing gaseous vapor toward work piece 122. Gas source 146 includes a reservoir 154 with a heater, which may comprise a membrane type heating device and can be used for raising the temperature of a compound within reservoir 154 to a temperature for providing a suitable stream of molecules for beam-induced reactions as hereinafter more fully disclosed. A transfer tube or nozzle 156 comprising a capillary tube provided by a hypodermic needle extends from reservoir 154 and is connected thereto via control valve 158 adapted for releasing gaseous vapor. The nozzle is extended and translated in orthogonal directions substantially perpendicular to its axis employing translation apparatus 148, so that gaseous vapor can be aimed directly toward a region on the target surface of work piece 122.

A door 160 is opened for inserting work piece 122 on stage 124 which may be heated, and also for servicing the reservoir 154. The door is interlocked so that it cannot be opened if the temperature in reservoir 154 is substantially above room temperature. A gate valve, schematically illustrated at 162, is closed before door 160 can be opened to seal off the ion source and focusing column apparatus.

When reservoir 154 is raised to a desired temperature for vaporizing the compound within reservoir 154, valve 158 may be opened by withdrawing an actuator rod from outside the apparatus to open and regulate the position of valve plunger, while the nozzle 156 is directed towards the desired area of the work piece. Bellows 152 accommodates movement of the nozzle assembly and reservoir relative to the work piece without affecting the vacuum within chamber 126.

The vacuum control system along with the heater of gaseous vapor source 146 are operated to provide an appropriate vapor pressure condition for establishing a gaseous vapor flux in the chamber as directed toward substrate 122 for etching or depositing material. To establish a given gaseous flux, the reservoir is heated to a predetermined temperature.

The high voltage power supply provides an appropriate acceleration voltage to electrodes in ion beam column 116 for energizing and focusing ion beam 118. When it strikes the work piece having condensed gaseous vapor adhered thereupon, the ion beam provides energy for initiating a reaction between the gaseous compound and the substrate and for either enhanced etching of or material deposition upon the work piece.

Deflection controller 136 causes the ion beam to be deflected along a desired path for etching work piece 122. Considerations regarding deflection speed, loop time, etc. are well understood by those skilled in the art. It is worth pointing out, however, that with embodiments of the present invention, relatively fast beam sweeps are not required. In some cases, for example, a structure may be formed using a single, relatively slow sweep of the beam. This also allows for the use of beams of low current densities, which can be beneficial with gas injected processes.

As mentioned earlier, the vacuum system provides a vacuum of between approximately $1\times10^{-7}$ Torr and $5\times10^{-4}$ Torr within chamber 126. With emission of gaseous vapor, the chamber background pressure is suitably about $1\times10^{-5}$ Torr. In an exemplary embodiment, the gaseous source 146 is heated to a temperature for providing an appropriate gaseous flux via the capillary tube of the hypodermic needle, while the metal ion source and focusing column are suitably controlled for generating a corresponding appropriate ion flux. Skilled persons can readily determine appropriate pressures and gas flows for any particular application.

Figures 2A, 2B:
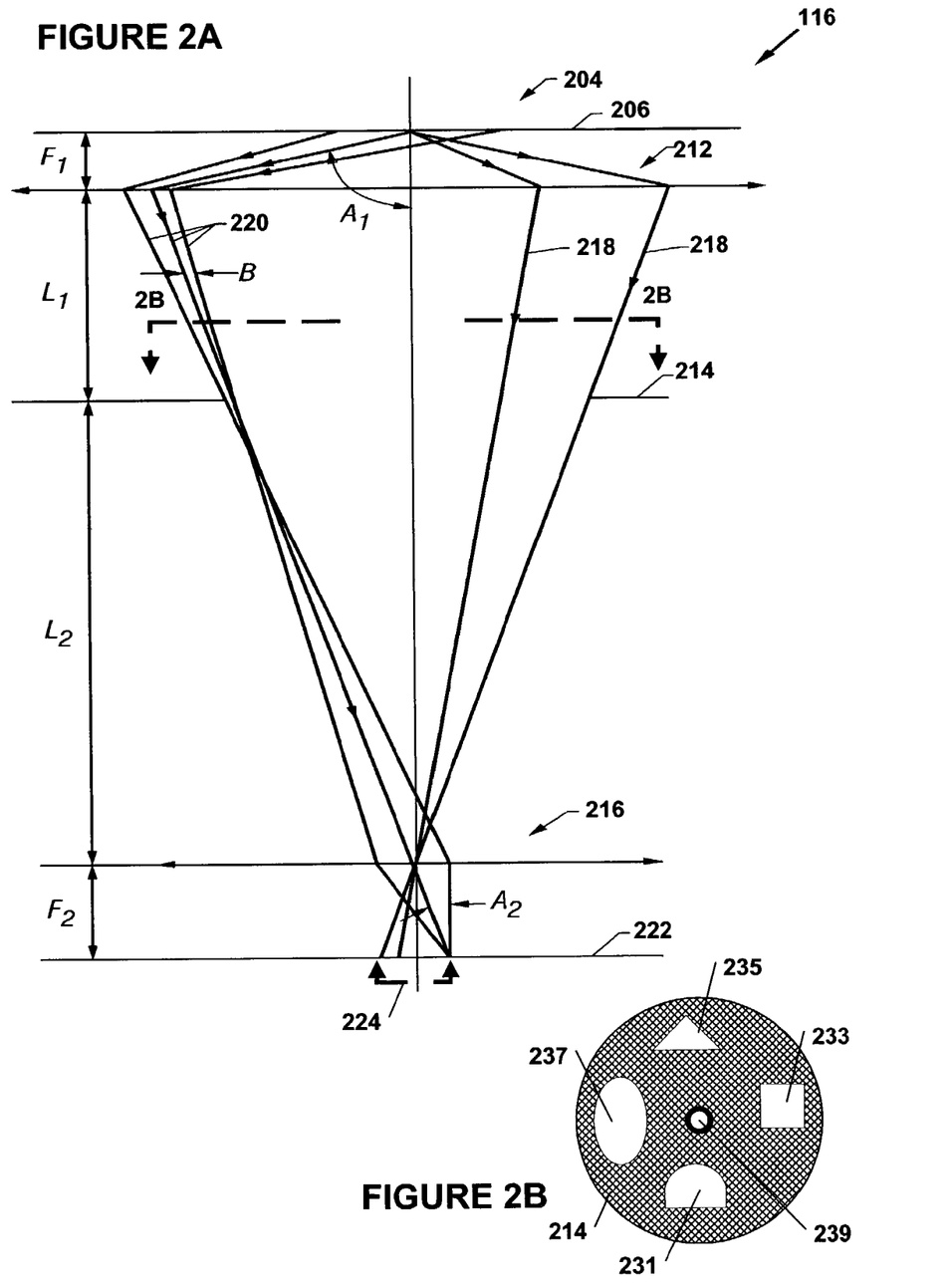
FIG. 2A is a ray diagram of a focused ion beam column in accordance with an aperture imaging embodiment of the present invention.
FIG. 2B is a top view of the schematically depicted aperture member of FIG. 2A taken along line 2B—2B.

FIG. 2A shows a ray diagram for focused ion beam column 116 in accordance with an aperture imaging embodiment of the invention. The actual physical elements are not shown in FIG. 2A. Rather, the planes of the lens and aperture elements are shown with the reference numbers indicating where the elements would be. Ion column 116 includes a source 204 positioned on a source plane 206. A first ion lens 212 has a focal length F1 and is positioned a distance F1 from source plane 206. A shaping aperture 214 is positioned a distance L1 from the plane of first lens 212, and a second lens 216 having a focal length F2 is located a distance L2 from shaping aperture 214. The magnification M1 of the source by first lens 212 is therefore (L1+L2)/F1 and the magnification of the shaping aperture by second lens 216 is F2/L2. In one embodiment, L1 is 35 mm, L2 is 400 mm, F1 is 25 mm, F2 is 10 mm, giving an M1 of 17 and an M2 of 0.025.

The depicted ion column 116 provides an ion beam having a substantially uniform current density (and in turn, a uniform dosage profile) at target plane 222 where it projects the shaped beam onto the target surface at beam incidence region 224. The beam forms a reduced, that is, de-magnified, image of the aperture at the target surface at incidence region 224, the image having a high edge resolution value, that is, sharp or small edge widths. In other words, the impact region of the ions is in the shape of the aperture, with the ion bombardment rate being substantially uniform throughout the beam incidence region and dropping sharply to zero at its edge. For additional information regarding edge sharpness and other aspects of the depicted ion column, reference is made to commonly owned copending patent application Ser. No. 09/765,806, entitled "SHAPED AND LOW DENSITY FOCUSED ION BEAMS," filed on Jan. 19, 2001 by Gerlach et al.

FIG. 2B shows a top view of an aperture member 214 corresponding to the schematically depicted aperture member 214 of FIG. 2A. Aperture member 214 is a wheel structure that is rotatably adjustable about axis 239 for providing different selectable beam shapes. (Of course, as with the other components disclosed herein, any suitable device could be used. For example, in another embodiment, an aperture strip, e.g., adjustable along its longitudinal axis, is used in an alternative shaped beam system for selectively providing a desired beam shape.) The depicted aperture member 214 has four shape apertures including a semi-oval aperture 231, rectangular aperture 233, triangular aperture 235, and an elliptical aperture 237. However, persons of skill will recognize that an aperture member could provide a variety of suitable aperture shapes such as a square aperture, a circular aperture, and the like. Aperture shapes and dimensions will depend on available scan paths and desired structures to be formed. Examples of structures created with various beam shapes are discussed in the next sections.

Figure 3:
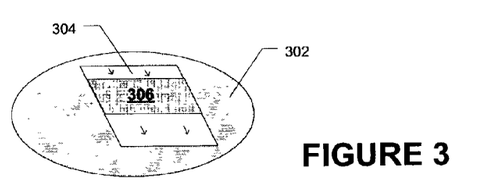
FIG. 3 is a perspective view of a beam incidence region on a target scan area of a work piece to be scanned.

FIG. 3 shows a perspective view of a target scan area 304 on the surface of scan object 302 It depicts a beam incidence region 306, which is the incidence (or contact) area made by the shaped beam and the target scan area. Within the context of this disclosure, a "shaped beam" refers to a beam (e.g., charged particle, light) having a desired cross-sectional shape that is typically a modification of the beam's "natural" shape. A shaped beam also generally has a substantially consistent (over time) current (or energy) profile at the beam incidence region. In one preferred embodiment, the current density is substantially uniform throughout the beam incidence region. The above described shaped ion beam system provides such a shaped beam. The term "current profile" refers to the beam's two-dimensional, particle flux pattern (or distribution) applied at the beam incidence region. For example, assume that an 8 micron by 8 micron square ion beam with a uniform current density of $10^9$ ions/$\mu m^2$/sec is used. If the beam is positioned onto the target scan area at a stationary position and activated for 100 seconds, then an 8 micron by 8 micron square with a uniform dose profile of $10^{11}$ ions per square micron would result. If the target scan area was composed of a material that sputters away at $2.5 \times 10^{-10}$ cubic microns per ion, then the resulting square void would be 4 microns deep.

The shaped ion beam discussed above has a substantially uniformly distributed current density. That is, the amount of ions applied to the surface at any point within the beam incidence region over a period of time is substantially the same when the beam incidence region is fixed. Again, while this is preferred, it is not necessary. The beam could have a non uniform current density profile, with the current density at all of the points within the beam at the incidence region preferably consistent and known. With a shaped beam, a desired dose array can be applied to the target scan area by using an appropriately shaped beam having a known current profile and scanned over the target scan area according to a suitable path at a suitable rate.

In the depicted figure, the beam aperture is rectangular, resulting in a rectangularly shaped beam incidence region 306. The arrows indicate that the beam is scanned over the target scan area 304 from its left boundary along the x axis to its right boundary. With a uniform current density, the resulting three dimensional structure will be a rectangular structure that is symmetrically ramped on two opposing sides. More on this will be addressed in the next sections, along with examples of beams with different shapes and the structures they can generate.

In this way, a desired dose array can be applied over the target scan area in a single frame, although several frame sweeps may be used and may be desirable. In this context, sweeping the beam incidence region over the target scan area in a single frame means that the beam incidence region does not substantially pass over the same portions of the target scan area more than one time, although several frame sweeps certainly may be desirable for a given task. Moreover, the path need not be continuous and it doesn't have to occur in a single direction.

The principles of the invention are illustrated below using simple shapes that are scanned in one dimension. In practice, more complex shapes can be used and the shaped beam can be scanned in two dimensions. FIGS. 4A through 6B show top views of exemplary target scan areas, 404, 504, and 604, respectively. With their origins designated at their lower left corners, the depicted scan areas are rectangularly shaped surfaces with M by N dimensions in the x and y directions, respectively. In these figures, the beam travels substantially in the z direction to apply dosages at the beam incidence regions to form positive or negative structures (milling or material depositioning) in the target scan areas. In the depicted examples, the beam shapes are rectangular (406), triangular (506) and circular (606). In each example, the beam incidence region is scanned once, at a constant rate, from the left boundary of the target scan area along the x axis, to the right boundary, as is indicated by the phantom (hashed) incidence region depictions and directional arrows.

Even though each scan path is the same in these examples, the resulting structures are different in accordance with the different beam shapes. This is illustrated in the accompanying graphs (FIGS. 4B, 5B, 6B), which show beam dosage curves taken along the x axis for three separate values of y: y=0, y=N/2, and y=N.

Figure 4A:
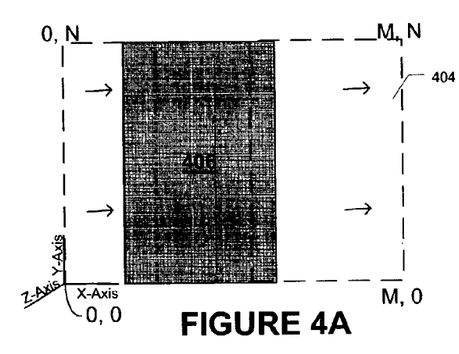
FIG. 4A is a top view of an exemplary rectangular shaped beam incidence region scanning from left to right along the x axis.
Figure 4B:
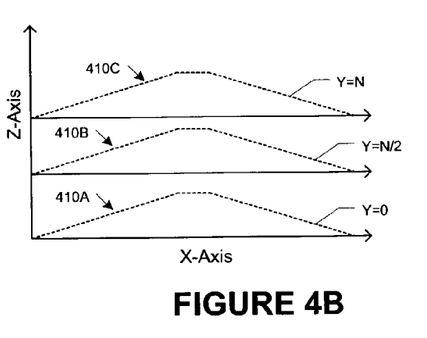
FIG. 4B is a graph showing dose profiles along the x-axis for three different y values in the scan of FIG. 4A.

With reference to FIG. 4B, the rectangular shaped beam generates dose curves, 410A, 410B, and 410C, that are the same for each value of y. This is so because the width of the rectangular incidence region is constant. With the incidence region being scanned in the x direction from the left to the right side, the dose curves ramp upward, flatten out, and ramp downward as x approaches the right edge of the target scan area. This results in a box structure having a rectangular outline and sloped, appositely facing edges on two of the four lateral sides.

Figure 8A:
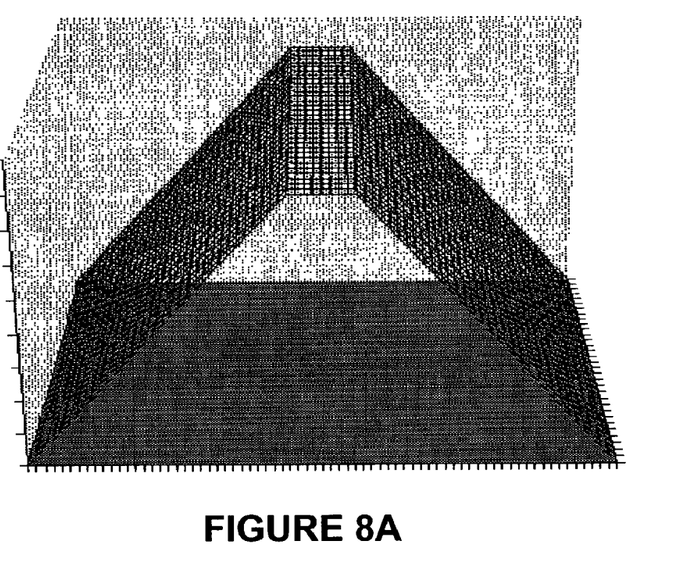
FIGS. 8A through 8C show computer generated graphs illustrating three-dimensional structures that could be created using three different beam shapes with the routine of FIG. 7.

As with all of the different beam shapes, a variety of different structures may be produced using a rectangular beam. For example, if the width of the beam incidence region is reduced relative to that of the target scan area, the width of the flat part of the curves decrease until the beam incidence region is half the width of the target scan area and triangular shaped dose curves result, corresponding to an "A"-shaped (or ramp) structure. As the beam incidence region width is further reduced from half the width of the target scan area, the flat part of the curves increases. That is, as the beam width approaches zero or as it approaches the width of the target scan area, the width of the flat section of the dosage curve increases. FIG. 8A illustrates a negative (milled) structure that was generated in a computer model using a rectangular shaped beam and a beam incidence region with a width less than half of the width of the target scan area.

Figure 5A:
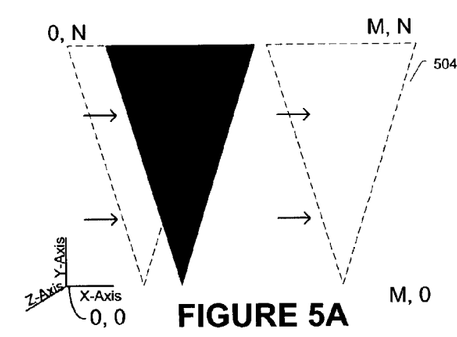
FIG. 5A is a top view of an exemplary triangular shaped beam incidence region scanning from left to right along the x axis.
Figure 5B:
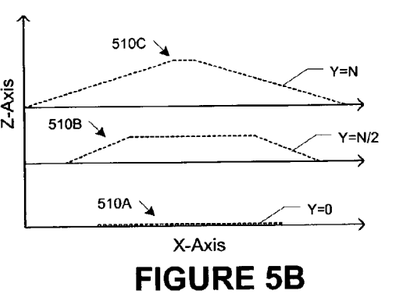
FIG. 5B is a graph showing dose profiles along the x-axis for three different y values in the scan of FIG. 5A.
Figure 8B:
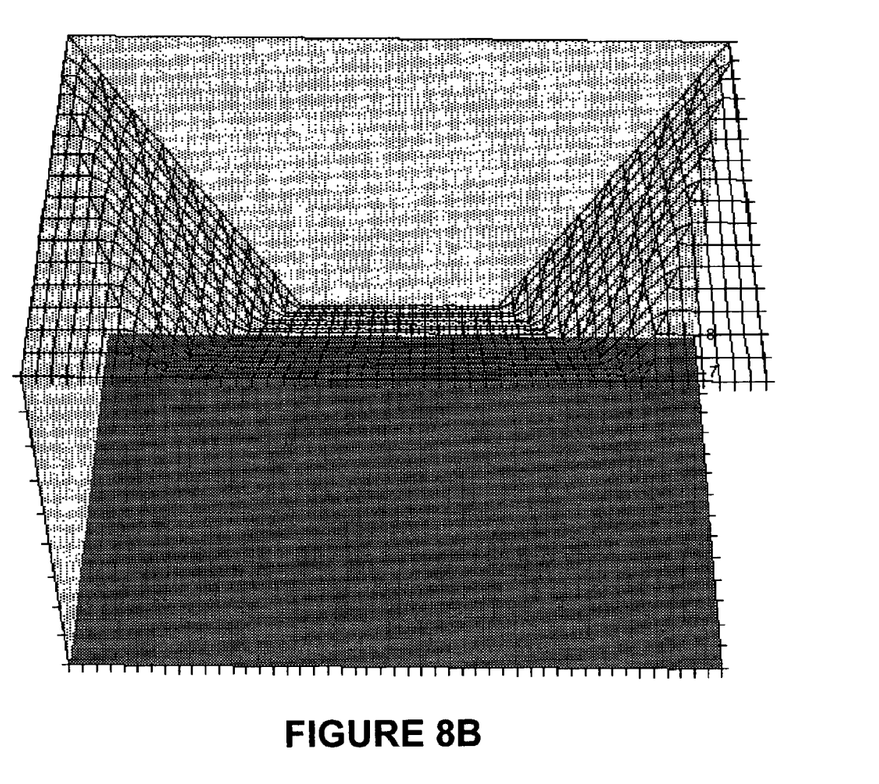

With reference to FIG. 5B, curves 510A, 510B, and 510C are dose curves for the triangular shaped beam scan in FIG. 5A for y=0, y=N/2, and y=N, respectively. With the downwardly pointing, triangular shaped incidence region 506, the dose values decline as the value of y moves toward 0. With the incidence region moving from left to right along the x axis, each curve corresponds to a ramp type function similar to those of the rectangular shaped beam except that their magnitudes decrease and their flat portions increase as y decreases. This results in a partial pyramid type structure being formed. An example of such a structure is shown in FIG. 8B, which is a computer generated model using an equilateral triangle with a width that is less than half the width of the target scan area.

A variety of structures may be formed with triangular shaped beams. For example, by using a triangle similar to that in FIG. 5 but with its width equal to half that of the target scan area, a half pyramid structure may be formed. By using two separate left-to-right sweeps, one atop the other, with the triangle pointed downward in the lower sweep and upward in the upper sweep, one could generate a full pyramid. Pyramids are useful structures. For example, by building a positive pyramid structure (e.g., material deposition), a magnetic storage device recording head could be created. In addition, partial pyramids milled into an object are useful for cross-sectional analysis such as in a semiconductor manufacturing process.

Figure 6A:
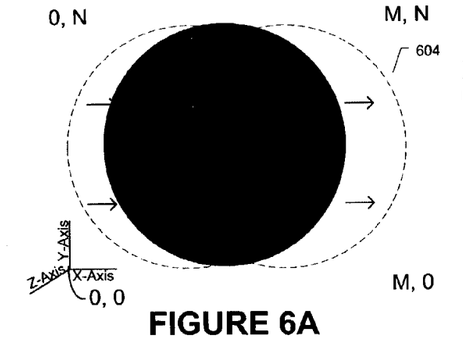
FIG. 6A is a top view of an exemplary circular shaped beam incidence region scanning from left to right along the x axis.
Figure 6B:
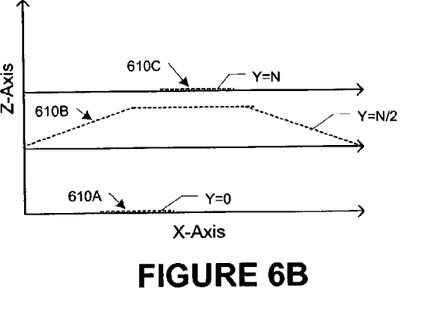
FIG. 6B is a graph showing dose profiles along the x-axis for three different y values in the scan of FIG. 6A.

FIG. 6B shows dose curves 610A, 610B, and 610C for the three y values, y=0, y=N/2, and y=N for the circular beam sweep of FIG. 6A. The dose magnitude and flat portions are higher in the center portions along the y axis and decline moving upwardly and downwardly along the y axis from the line at y=N/2. This results in a bowl type structure as is depicted in the computer generated graph of FIG. 8C. Among other things, circular beams can be used to create spherical type structures.

Figure 7:
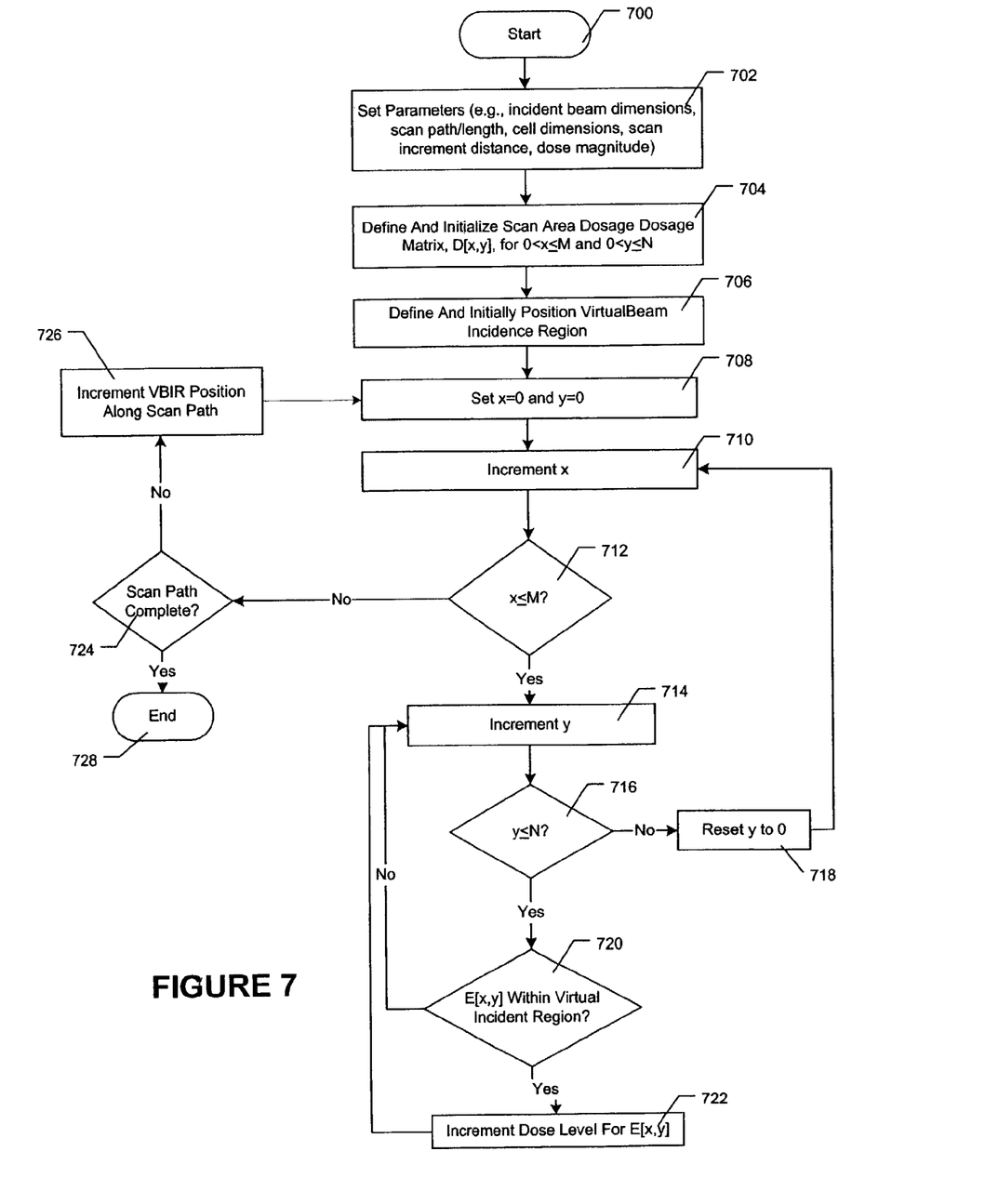
FIG. 7. is an exemplary routine for modeling a dosage array using a scanning process of the present invention.

FIG. 7 is a flow diagram of a routine 700 for modeling three dimensional structures generated using different beam shapes and scan paths. This routine generates a dose array based on specifically entered beam shape and scan pattern parameters. The dose array is typically composed of memory "cells" that map to corresponding cell locations on the target scan area. When the routine is executed for a shaped beam with a given set of path parameters, each memory cell will contain a numerical value proportional to the beam particle dosage that would be applied on the target scan area at the corresponding cell (or virtual dwell point) location. With such a dose array, a three-dimensional graph can be generated for modeling the structure that would be generated if a shaped beam is actually scanned over a target scan area according to the modeled parameters. In one embodiment, a conventional graphing application such as Exel™, available from Microsoft™ Corp, is used to three-dimensionally graph the dose array.

Since routine 700 is normally implemented with a computer program, it is performed using a discrete time model. In practice, however, a beam scan may occur in continuous or quasi-discrete time. With this in mind, the routine can be used to model, with tolerable approximation errors, various beam shapes, dosage magnitudes, and scan paths for generating desired three-dimensional structures.

In the depicted routine, at step 702, the scan parameters are established (e.g., defined, received from a user). These parameters include beam incidence region parameters, target scan area parameters, path parameters such as route and scan increment distance, cell size parameters, current density parameters, and the like. Next, at 704, the target scan area dose array is defined for an M by N scan area. This is a two-dimensional array with each dimension corresponding to the x and y axes. The size of the array (number of M by N memory slots) will normally depend on the size of the cells used to make up the target scan area. The smaller the cell size, the larger the number of memory slots required to implement the array. In this step, the dose array values are set to 0. At 706, the routine positions a virtual beam incidence region at its designated initial position. This is determined by the designated scan path. for example, with the previously discussed examples of FIGS. 4, 5, and 6, the virtual beam incidence region would initially be positioned along the left side of the target scan area. However, depending on the desired three-dimensional structure, a scan path could have the incidence region begin at any desired position relative to the target scan area.

The next few steps correspond to the loops that are used to check each array cell in order to determine if it is in the virtual beam incidence region for a given point on its path. It is convenient to think of this M by N array as corresponding directly to the target scan area. At step 708, x and y (which serve as index parameters for the dose array) are each set to 0. This is done even though there are no cells at 0, 0. They are initially set to 0 in conjunction with the operation of the loops for this embodiment. At step 710, the value of x is incremented and at step 712, the routine confirms that the value of x is less than M. Likewise, at step 714, the value of y is incremented and at step 716, the routine determines if y is less than N. Thus, in the first pass through the loop, the first checked dose array cell is at x=1, y=1. Accordingly, with a target scan area such as the one used in FIGS. 4 through 6, this cell would map to the lower left corner of the scan area. In the remaining steps, the routine, beginning at this first cell, loops through each cell in the dosage array for each path position of the virtual beam incidence region to see if the cell is "exposed" to the incidence region for that position. When this is completed, the array contains dosage levels for each cell representing the dosage that would be received by the corresponding virtual dwell point in an actual target scan area if the modeled shaped beam and path is used for scanning a target scan area.

At step 720, if x and y are less than M and N, respectively, (indicating that the indices are valid and map to a cell in the dosage array), the routine determines if the cell is within the virtual beam incidence region. If so, the dose level is incremented for that cell at step 722, and the routine loops back to step 714 and proceeds as previously described. The amount by which the cell dosage level is incremented will typically depend on the actual current density and scan rate in connection with the designated dose array cell size. If the cell is not in the beam incidence region, then the routine loops directly back to step 714 from decision step 720. Thus, steps 714 through 722 constitute a loop for checking all of the N cells for a given value of x by sequentially incrementing y (at step 714). When the value of y reaches N+1 (which is outside of the array), then at step 716, the routine proceeds to step 718 (instead of decision step 720) and resets the value of y back to 0. From here, the routine loops back to step 710 where it increments the value of x and proceeds from here as previously described. Each time the routine loops back to step 710 from step 718, a new column of cells for the "next" value of x are checked to see if they are in the virtual beam incidence region for the current path position. Eventually, the value of x is incremented to M+1. Once this occurs, the routine proceeds to step 724 from decision step 712 instead of going to step 714. At decision step 724, it checks to see if the virtual beam incidence region has completed the scan path. If not, it proceeds to step 726, increments the virtual beam incidence region along the path and loops back to step 708. Here, it resets both x and y back to 0 and proceeds through the loops to once again check all of the cells to see if they are in the virtual beam incidence region for this next beam incidence region position along the path. If, however, at step 724, if it is determined that thee path is complete, then the routine ends at step 728.

Figure 8C:
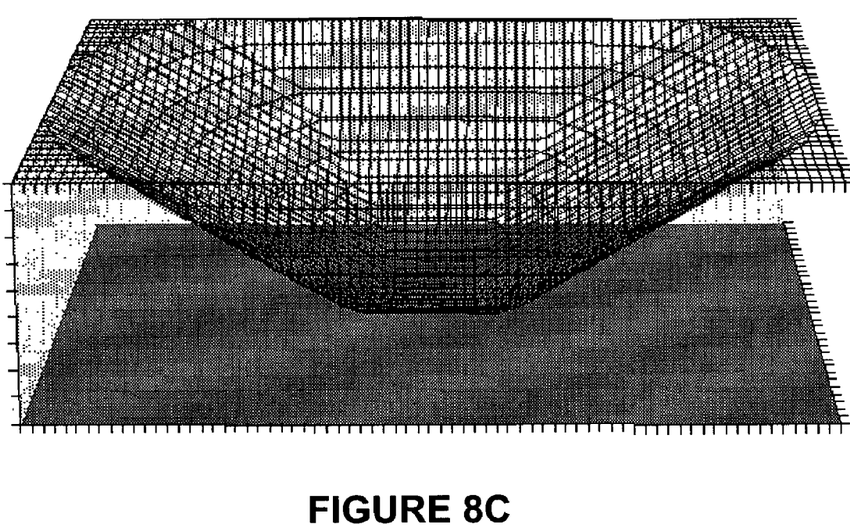

FIGS. 8A through 8C show computer generated three-dimensional structures using a shaped beam scanning routine such as the one just described. FIG. 8A is a graph of a positive (e.g., material deposition) structure generated with an 8 micron square beam incidence region using a single left to right scan traveling 9 microns along the x axis. FIG. 8B shows a graph of an etched structure generated using an 8 micron equilateral triangular beam scanning from left to right 16 microns along the x axis. Finally, FIG. 8C shows a graph of a structure generated using an 8 micron circular beam scanning from left to right 10 microns along the x axis.

Once an appropriate beam shape, size, dosage profile, and scan path have been determined for achieving a desired structure, the structure may be generated using a suitable shaped beam and scan path incorporating these parameters. With the methods presented in this disclosure, the actual scanning should be understood by persons of skill in the art. In fact, again, it is one advantage of this method that a wider variety of conventional beam types using lower current densities can be used to create precise micro-structures.

Figure 9:
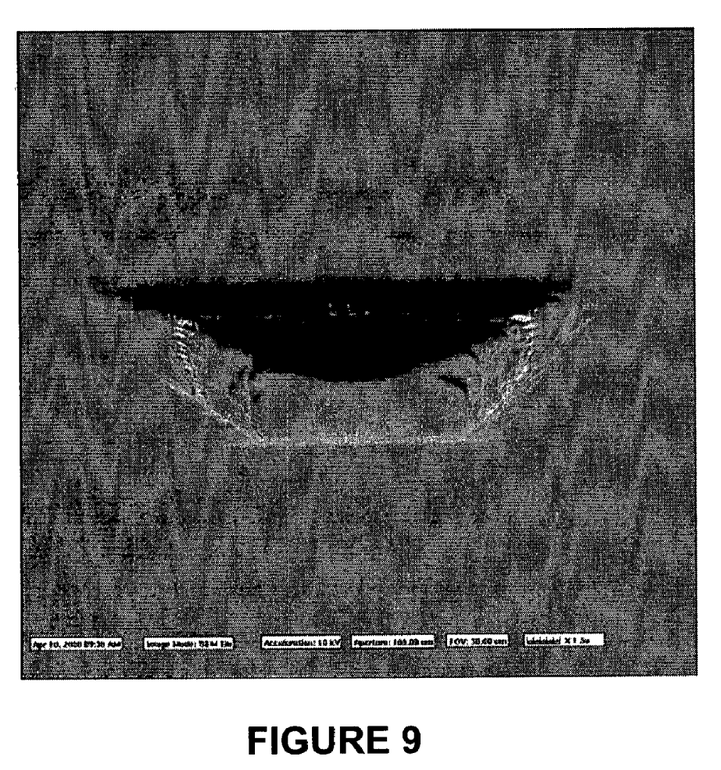
FIG. 9 shows a magnified picture of a milled target scan area using a scan process of the present invention.

FIG. 9 is a picture of a magnified target scan area site with a milled pyramid type structure resulting from a shaped beam scan process. With this example, a shaped focused ion beam having a triangular cross-section with a current density of about 0.075 nano amps/square micron] was used. The beam was scanned from left to right at a rate of about 1 KHz.

With the presented shaped beam process, material can be added or removed with an acuity that rivals (or even exceeds) existing methods relying on beams having smaller diameters than the smallest facet to be removed or added. Other, easier to attain beams can be used as long as their edges are sufficiently "sharp" (smaller than the smallest facets of the microstructure being created). This makes the process well-suited for use in shaped beam systems, where a beam illuminated aperture becomes the object of a projection optic. The allowed scanning methods enable the use of low brightness ion sources to produce features that would otherwise require a high brightness source with existing focused probe methods. Compared to high brightness, high current density beams, low brightness, high current beams are less likely to deplete the chemical compounds adhered to the work piece surface, the chemical compounds either decomposing in the presence of the beam to deposit a material or assist the beam in etching the work piece. In addition, unlike existing high brightness methods, it can be used with many different ion species such as from plasma sources, in order to introduce or avoid certain undesirable chemical reactions (e.g., gallium contamination). It also allows users to utilize various particle sources such as lasers and electron beam sources. Furthermore, it can significantly speed up the deposition process because low current-density shaped beams can be used to deposit without requiring costly "refresh" times, which can add significant overhead to a growth operation.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a microscopic three-dimensional structure, comprising:
   providing a work piece having a target scan area;
   forming a shaped beam using a shaping aperture and at least one focusing lens;
   focusing the shaved beam on the work piece, the intersection of the shaped beam and the work piece forming a boundary incidence region with a desired shape, said shaped beam having a substantially uniform beam intensity throughout the boundary incidence region; and
   scanning the shaped beam across the surface of the workpiece the workpiece by using deflectors that are positioned between the shaping aperture and the work piece and scanning said beam within the target scan area according to a predefined path resulting in a desired dose array being applied to the target scan area whereby a three dimensional structure corresponding to the dose array is formed on the target scan area.

2. The method of claim 1 in which scanning the shaped beam across the surface of the workpiece within the target scan area according to a predefined path further comprises
   defining a plurality of virtual dwell points within the target scan area; and
   scanning the shaped beam across the work piece, different ones of the virtual dwell points coming into the moving beam incidence region and leaving the beam incidence region as the beam moves across die work piece, the beam providing different doses to different ones of the virtual dwell points as the different dwell points remain in the beam incidence region for different lengths of time during the beam scan.

3. The method of claim 1 in which forming a shaped beam includes forming a shaped charged particle beam.

4. The method of claim 1 in which scanning the shaped beam across the surface of the workpiece further comprises removing material from the workpiece surface by milling.

5. The method of claim 1 in which scanning the shaped beam across the surface of the workpiece further comprises beam-induced deposition of a material onto the work piece.

6. The method of claim 1 in which focusing the shaped beam on the work piece comprises using at least one focusing lens located between the shaping aperture and the workpiece to focus an image of the aperture on the surface of the workpiece.

7. The method of claim 6 in which the at least one focusing lens comprises at least one electrostatic or magnetic lens.

* * * * *